(12) United States Patent
Horvath et al.

(10) Patent No.: US 8,729,925 B2
(45) Date of Patent: May 20, 2014

(54) CONFIGURABLE BUFFER FOR AN INTEGRATED CIRCUIT

(75) Inventors: András Vince Horvath, Budapest (HU); Abdulkerim L. Coban, Austin, TX (US); Pio Balmelli, Austin, TX (US); Ramin Khoini-Poorfard, Austin, TX (US); Alessandro Piovaccari, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 150 days.

(21) Appl. No.: 13/526,060

(22) Filed: Jun. 18, 2012

(65) Prior Publication Data

US 2013/0335639 A1   Dec. 19, 2013

(51) Int. Cl.
*H03K 19/0175*   (2006.01)
*H03B 1/00*   (2006.01)
*H03L 5/00*   (2006.01)

(52) U.S. Cl.
USPC ............. 326/82; 326/87; 327/108; 327/109; 327/332

(58) Field of Classification Search
USPC ........... 348/725, E5.138, 749, 751, 761, 790, 348/739; 345/87, 690; 326/82–87; 327/108, 327/109, 332

See application file for complete search history.

(56) References Cited

U.S. PATENT DOCUMENTS

| | | | | |
|---|---|---|---|---|
| 4,441,068 A | * | 4/1984 | Smith | 323/351 |
| 4,827,158 A | * | 5/1989 | Matsumura | 327/108 |
| 4,963,764 A | * | 10/1990 | Quan | 327/109 |
| 6,388,477 B1 | * | 5/2002 | Juang | 327/112 |
| 7,928,878 B1 | | 4/2011 | Coban et al. | |
| 8,027,394 B2 | | 9/2011 | Nicolas | |
| 8,471,630 B2 | * | 6/2013 | Lin | 330/51 |
| 2005/0140400 A1 | * | 6/2005 | Yi et al. | 327/108 |
| 2013/0106516 A1 | * | 5/2013 | Lin | 330/260 |

OTHER PUBLICATIONS

Silicon Labs, "Si2176, Worldwide Hybrid TV Tuner IC with Analog Demodulator," Sep. 20, 2011, 2 pages.

* cited by examiner

*Primary Examiner* — Thienvu Tran
(74) *Attorney, Agent, or Firm* — Trop, Pruner & Hu, P.C.

(57) ABSTRACT

In one embodiment, an internal buffer may be provided within an integrated circuit (IC) to convert a signal to an output current to be output via a pin of the IC, under control of a switch which can be controlled based on a configuration setting of the IC, and may selectively directly couple the signal to the pin when the IC is coupled to an external driver circuit.

11 Claims, 5 Drawing Sheets

CONFIGURABLE BUFFER FOR AN INTEGRATED CIRCUIT

BACKGROUND

Certain integrated circuits (ICs) can be configured in many different types of systems. Often times, an output from the IC can be coupled to other circuits in a system via some kind of interim or intermediate circuitry. This circuitry can take different forms in various systems such as AC-coupled circuits and DC-coupled circuits. To enable interfacing of an IC that has a specific type of output, oftentimes this interim circuitry can be provided by way of an AC-coupled external driver to thus receive the IC output and buffer it into an appropriate form for coupling to another location.

While these buffer circuits typically work well, they increase the size, cost and complexity of a system. Furthermore, the IC has limited flexibility to be incorporated into various devices, as the IC is generally configured to provide only a particular type of output signal (i.e., AC or DC coupled outputs).

SUMMARY OF THE INVENTION

According to one embodiment, an apparatus includes an amplifier configured on an integrated circuit (IC) to receive and amplify an input signal received via a first input terminal of the amplifier to an amplified signal to be output via a first pin of the IC. In turn, a feedback loop may be coupled between an output of the amplifier and the first input terminal. This loop may include a first path having a switch enabled to selectively directly couple the amplified signal to the pin and a second path having a buffer to convert the amplified signal to an output current to be output via the pin, when the switch is disabled. The switch can be controlled based on a configuration setting of the IC, and may selectively directly couple the amplified signal to the pin when the IC is to couple to an external driver circuit, and be disabled when the IC is to directly couple to a predetermined impedance.

In an embodiment, the buffer may include a converter to convert the amplified signal to a current signal, a first current mirror to receive the current signal and to amplify the current signal to a first amplified current signal, and a second current mirror coupled to the first current mirror to receive and amplify the first amplified current signal to an output current, and to output the output current to the pin.

Another aspect of the present invention is directed to a method including reading a configuration register of a tuner to obtain a control value, controlling switches based on the control value, receiving and processing a radio frequency (RF) signal in the tuner to output a driven CVBS signal from a drive circuit of the tuner, and outputting the driven CVBS signal directly from the driver circuit to an output pin of the tuner when the tuner is coupled to an AC-coupled load. The driven signal can be buffered in an internal buffer of the tuner and coupled to the output pin when the tuner is coupled to a DC-coupled load.

Yet another aspect of the present invention is directed to a system that includes an antenna to receive an RF signal and a tuner coupled to the antenna. In one implementation, the tuner includes a mixer to mix the RF signal to a second frequency signal, a digitizer to digitize the second frequency signal, a digital signal processor (DSP) coupled to the digitizer to process the digitized second frequency signal and to demodulate the processed digitized second frequency signal when the RF signal includes an analog TV signal, a driver to output the analog TV signal to an output pin in a first mode, and a buffer coupled to the driver to receive the analog TV signal and to provide the analog TV signal to the output pin as a buffered signal in a second mode. The system may include a configuration register to store a control value used to enable the buffer in the second mode when the tuner is coupled to a processor via a transmission line and to disable the buffer in the first mode when the tuner is coupled to the processor via an external driver.

DETAILED DESCRIPTION

In various embodiments, an integrated circuit (IC) can be provided with an internal buffer to provide multiple modes of operation of the circuit and to enable its coupling to various system configurations with great amounts of flexibility. For purposes of discussion, a representative circuit including an internal buffer is for a TV tuner that is integrated on a single semiconductor die, such as a single-die complementary metal oxide semiconductor (CMOS) die. However, understand the scope of the present invention is not limited in this regard, and embodiments of an internal controllable buffer can be implemented in many other types of ICs, driving (e.g., 75 ohm) transmission lines, such as radio frequency (RF) or intermediate frequency (IF) circuits.

Figure 1:
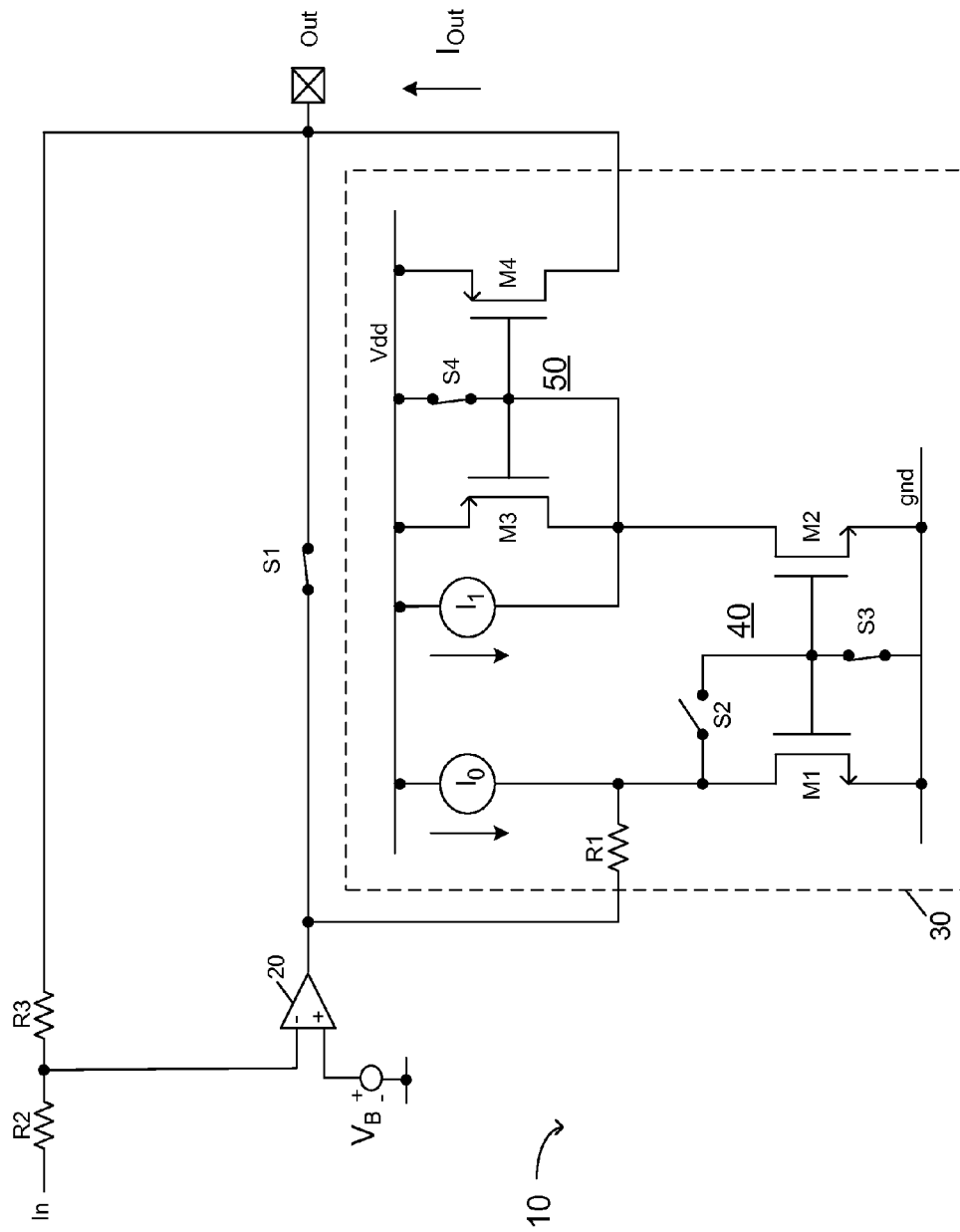
FIG. 1 is a schematic diagram of a circuit in accordance with an embodiment of the present invention.

Referring now to FIG. 1, shown is a schematic diagram of a circuit in accordance with an embodiment of the present invention. As shown in FIG. 1, circuit 10 can be used to provide a configurable option to output signals from a tuner in different states depending on what is connected to the tuner. More specifically circuit 10 can include an internal buffer 30, which in an embodiment can drive a 75 ohm transmission line and a 75 ohm DC-coupled resistive load to buffer a voltage signal into a current signal so that it can be output to a DC-coupled output such as a transmission line without an external buffer. Alternately, the buffer can be controlled to be disabled such that instead an output voltage is provided to an external buffer that can be implemented e.g., via an AC-coupled external driver. As will be described further below, in various embodiments this circuit can be configured via programmable mechanisms via a controller or other logic, e.g., as set by a system configuration which can be represented by a control value stored in a configuration register or other location.

As seen in FIG. 1, circuit 10 includes an input (In) to receive an incoming signal which may be provided from a processing circuit to an amplifier 20. In the embodiment shown, amplifier 20 can be implemented as an operational amplifier (op amp). To this end the incoming signal can be coupled via a voltage divider formed of resistors R2 and R3 to a first (inverting) input terminal of amplifier 20. In turn, a second (non-inverting) input terminal of amplifier 20 may be provided with a bias voltage $V_b$. Amplifier 20 acts as a driver to thus receive this input voltage and generate an output voltage.

Depending on configuration of circuit 10, this output voltage may be provided to an output node, Out, which may be coupled to an output pin of an integrated circuit (IC) including the tuner. This configuration can be realized by enabling a first switch S1 to be closed such that a short circuit is present from the output terminal of amplifier 20 to the circuit output node to thus provide an output voltage at this output terminal. Note that when switch S1 is enabled (i.e., closed) this bypass switch thus shorts an internal buffer 30 (which may be disabled in this configuration). As this switch is inside a feedback loop of the amplifier, a relatively small switch can be used without significant degradation of the amplifier. This mode may be enabled when there is an AC-coupled external driver or other such AC-coupled circuit coupled to the tuner.

In contrast, when the circuit is to be coupled without such external buffer, internal buffer 30 may instead be used. To enable this circuit, switch S1 may be opened or turned off, thus enabling buffer 30. As seen, buffer 30 when enabled may have switch S2 closed (i.e., on) and switches S3 and S4 opened (i.e., off) (and all switches S2-S4 vice versa when the buffer is not enabled). In general, buffer 30 may include a converter and a pair of amplifiers, namely a dual-stage current amplifier. The converter may be a voltage-to-current converter and can be implemented in the embodiment shown via a resistor R1, thus generating an input current that may be provided to gate terminals of a pair of metal oxide semiconductor field effect transistors (MOSFETs) M1 and M2, which may be part of a first current mirror 40 formed of these two NMOS devices. Note that with switch S2 on MOSFET M1 is in a diode-connected configuration with commonly coupled gate and drain terminals. Both transistors M1 and M2 have their source terminals coupled to a predetermined reference voltage node, which in an embodiment can be a ground voltage node.

In turn, the resulting output of this current mirror may be provided via a drain terminal of MOSFET M2 to an input terminal of a second current mirror 50. As seen, this current mirror may be formed of a pair of MOSFETs M3 and M4, more specifically a pair of PMOS devices having commonly coupled gate terminals. As seen, the resulting amplified output current can be provided from a drain terminal of MOSFET M4 as an output current $I_{out}$ provided to output node Out.

As further shown, a pair of current sources $I_0$ and $I_1$ may be present and can be used to bias current mirror 40. More specifically, the first current source $I_0$ may set a gate-to-source voltage of MOSFET M1 to a voltage of approximately VDD/2, providing a balanced load to amplifier 20. In turn, second current source $I_1$ sets a V=0 condition. Note that the value of resistor R1, and the ratio of M1, M2, M3, M4 may determine the relation between the output swing of amplifier 20 and the output current range. In an embodiment, this ratio may be close to, but less than 1. The enabled buffer is inside the feedback loop of the amplifier 20. In an embodiment, the ratio may be $$\frac{1}{R_1} \times \frac{M2}{M1} \times \frac{M4}{M3} \times RL < 1,$$

where RL is the total load impedance of 150 ohms.

As described above, by incorporation of an internal buffer, such as the 75 ohm buffer shown in FIG. 1, tuner 10 can be incorporated into different system implementations, namely an implementation including an AC-coupled external driver, and in a different system instead providing a DC-coupled 75 ohm output.

Figure 2:
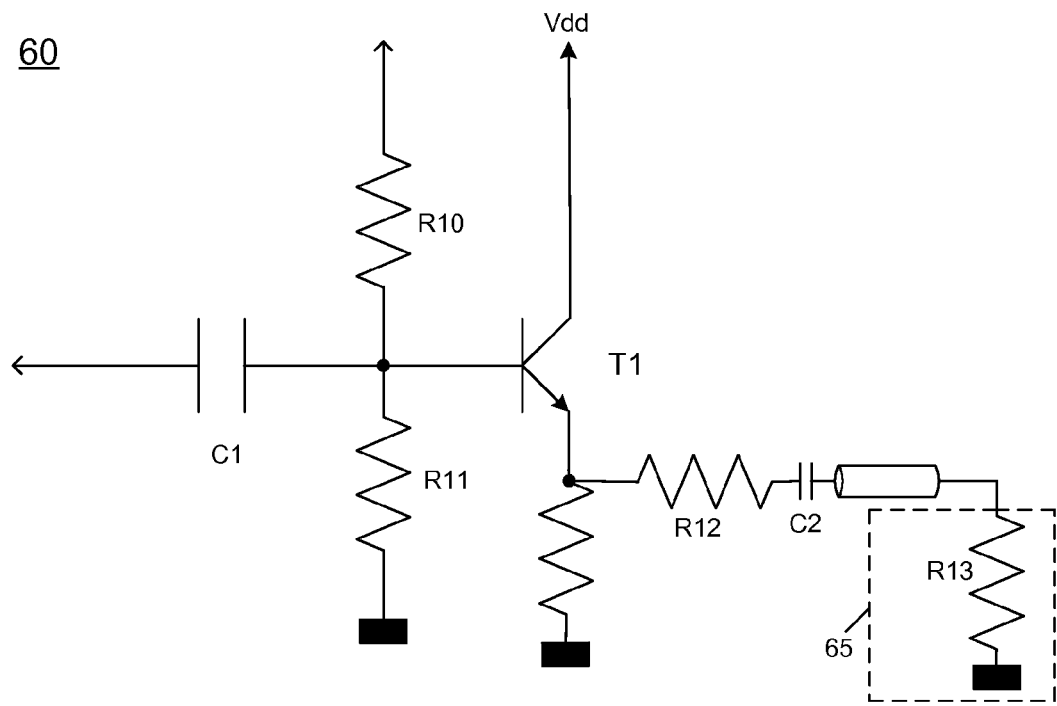
FIG. 2 is a schematic diagram of a transmission line driven by an external driver.

Referring now to FIG. 2, shown is a schematic diagram of an output driver to which a tuner in accordance with an embodiment of the present invention may be coupled. As shown in FIG. 2, circuit 60 may be an AC-coupled external driver including a bipolar transistor T1 that is AC-coupled to receive the output of a tuner via an AC-coupling capacitor C1 and a voltage divider presented by resistors R10 and R11. As seen, transistor T1 may be configured as an emitter follower receiving this AC-coupled signal via its base terminal and outputting the signal to a transmission line via a 75 ohm resistor (R12) and a DC blocking capacitor (C2) and on to a video decoder 65 including a 75 ohm resistor R13.

Figure 3:
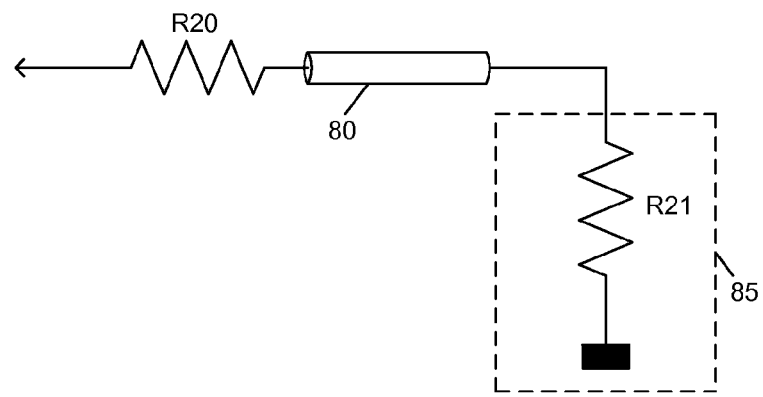
FIG. 3 is a schematic diagram of a transmission line to which a tuner in accordance with an embodiment of the present invention may be coupled.

Instead in other implementations, a tuner in accordance with an embodiment of the present invention may be directly DC-coupled to a processor via a transmission line such that the tuner can directly drive a CVBS line input to a video processor or other such processor via a transmission line. As seen in FIG. 3, circuit 70 may be a DC-coupled arrangement with a pair of termination resistances RESD+R20 and R21 coupled at either end of a transmission line 80 that may couple the tuner to a video processor, namely video decoder 85. (The input termination of the transmission line is dominated by the sum of R20 and the electrostatic discharge output impedance ($R_{ESD}$) of the driver (shown in FIG. 4). Both terminations can match the characteristic impedance of transmission line 80, which is 75 ohm by standard.) Note that while shown in FIG. 3 as being implemented as a cable, understand that the transmission line can take the form of any type of conductive element, from a circuit board trace, a cable such as a coaxial cable or any other type of conductive element.

Figure 4:
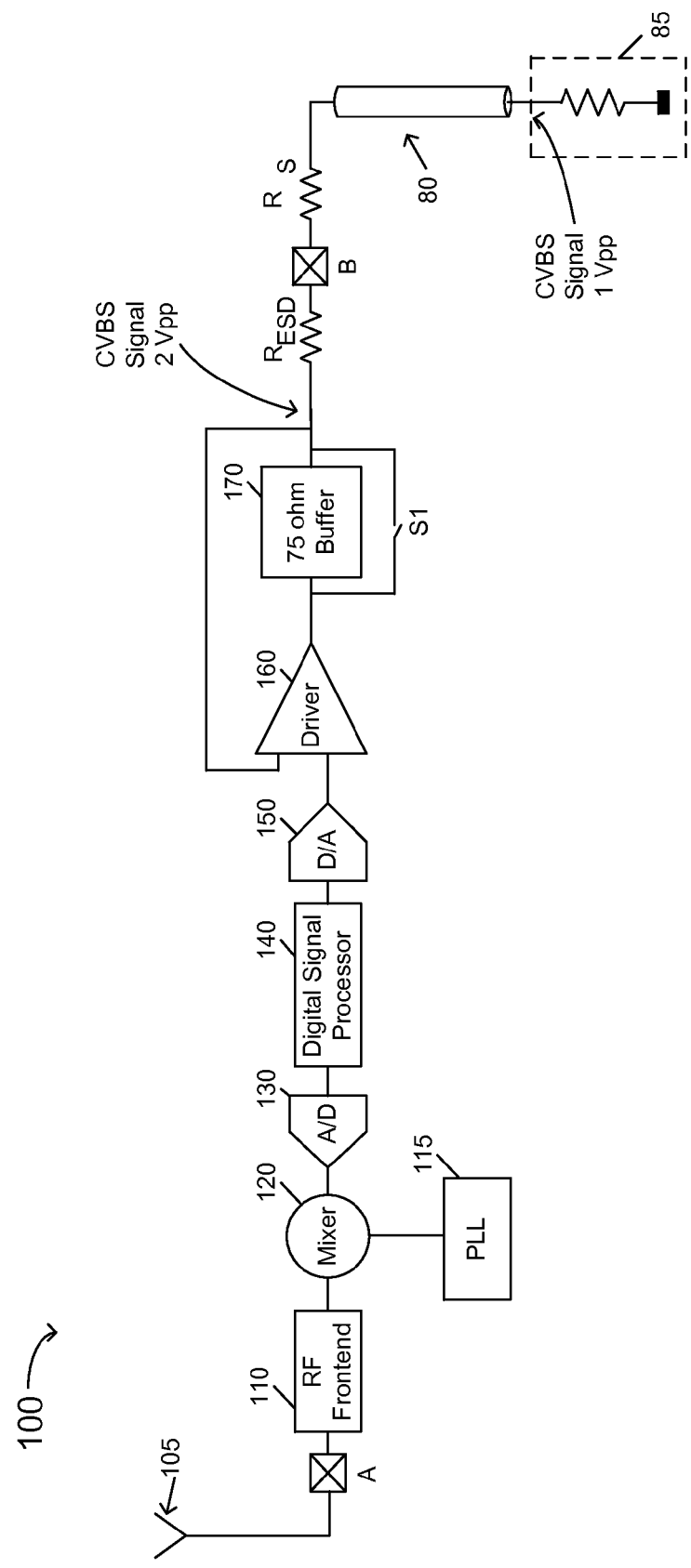
FIG. 4 is a block diagram of a tuner in accordance with an embodiment of the present invention.

Referring now to FIG. 4, shown is a block diagram of a tuner in accordance with an embodiment of the present invention. In the embodiment shown, tuner 100 may be configured to receive a variety of different incoming RF signals. In implementations in which tuner 100 is a television tuner, the incoming RF signal can be one of a variety of world wide terrestrial and cable TV standards including both analog and digital TV-based standards.

As seen in FIG. 4, incoming RF signals may be coupled through an antenna 105 to tuner 100 which as generally shown is coupled between an input pin A and an output pin B. Of course understand while only these two connections are shown for ease of illustration and reference to the buffer circuitry described herein, understand that many different pins may be provided on the tuner. Furthermore, the single-ended circuit is shown for ease of illustration, in other embodiments tuner 100 can handle incoming differential signals via a complex signal processing path. In many implementations tuner 100 can be configured on a single semiconductor die such as a CMOS die. As such, the internal buffer may be configured solely of CMOS devices, in contrast to conventional external buffers, which are typically formed of bipolar devices.

Incoming signals may be provided to an RF front end unit 110 which may generally receive and handle processing of the signals, e.g., via amplifiers or other gain control circuitry. The resulting signals are coupled to a mixer 120 which operates to downconvert the RF signals to lower frequency signals. In various embodiments, tuner 100 can be configured to be a low-IF tuner such that mixer 120 operates to downconvert the RF signal to a low-IF signal. However, understand the scope of the present invention is not limited in this regard. Mixer 120 may downconvert the signal responsive to a local oscillator signal received from a phase lock loop (PLL) 115 which in an embodiment can be implemented via a frequency synthesizer. Although shown as a single-ended mixer, understand that in various embodiments this mixer may be a complex mixer.

The resulting lower frequency signal is provided to an analog-to-digital converter (ADC) 130 which in an embodiment can be a delta-sigma ADC to thus digitize the low-IF signal and provide it to a digital signal processor (DSP) 140 which may perform various processing, depending upon the type of signal. For an analog TV signal, DSP 140 may perform various operations including demodulation of the signal to thus provide a resulting demodulated signal. Instead for digital signals, the DSP may perform other processing to generate a digital low-IF signal that can be provided to off-chip circuitry, such as via a separate digital demodulator path (not shown for ease of illustration in FIG. 4). However, understand that in some implementations it is possible to further perform digital demodulation within tuner 100.

Still referring to FIG. 4, after processing, the resulting digital signals may be provided to a digital-to-analog converter (DAC) 150 which thus converts the signal back to an analog signal. For purposes of illustration, assume the processed signal is a demodulated analog TV signal. As seen, the signal is provided to a driver 160 which may generally correspond to op amp 20 of FIG. 1. After amplification in the driver, the resulting signal, which may correspond to a CVBS signal, can be output via a buffer 170 which may be configured the same as buffer 30 of FIG. 1 to thus provide a CVBS signal which can be put through a termination resistance $R_{ESD}$ via output pin B. This is so, as switch S1 is opened in the configuration of FIG. 4 because tuner 100 is coupled to a 75 ohm impedance connection that includes a 75 ohm termination resistance formed of a source resistance $R_S$ and $R_{ESD}$ coupled to a transmission line 80 that in turn is coupled to a video decoder 85 including a 75 ohm termination resistance. Note that in various embodiments, attenuation of the CVBS signal may occur due to these resistances. Of course also understand that in a different configuration of tuner 100, switch S1 can be closed (i.e., active or on) to thus directly couple the voltage output of driver 160 to output pin B when instead tuner 100 is coupled to an external buffer such as driver 60 of FIG. 2. Note that the $R_{ESD}$ is always present. When S1 is closed, the output is a voltage driver with an output impedance of $R_{ESD}$, which may typically be 28 ohm. In this mode the output is not loaded by a 75 ohm transmission line, but other circuits (e.g., an external 75 ohm buffer as in FIG. 2) which load the driver with a much higher impedance, e.g., 1-10 kilo ohms. So in this case the $R_{ESD}$, is negligible. But when the 75 ohm transmission line is directly loading the driver, the $R_{ESD}$ is not negligible and is included in calculating the input termination impedance. Although shown at this high level in the embodiment of FIG. 4, understand the scope of the present invention is not limited in this regard.

Figure 5:
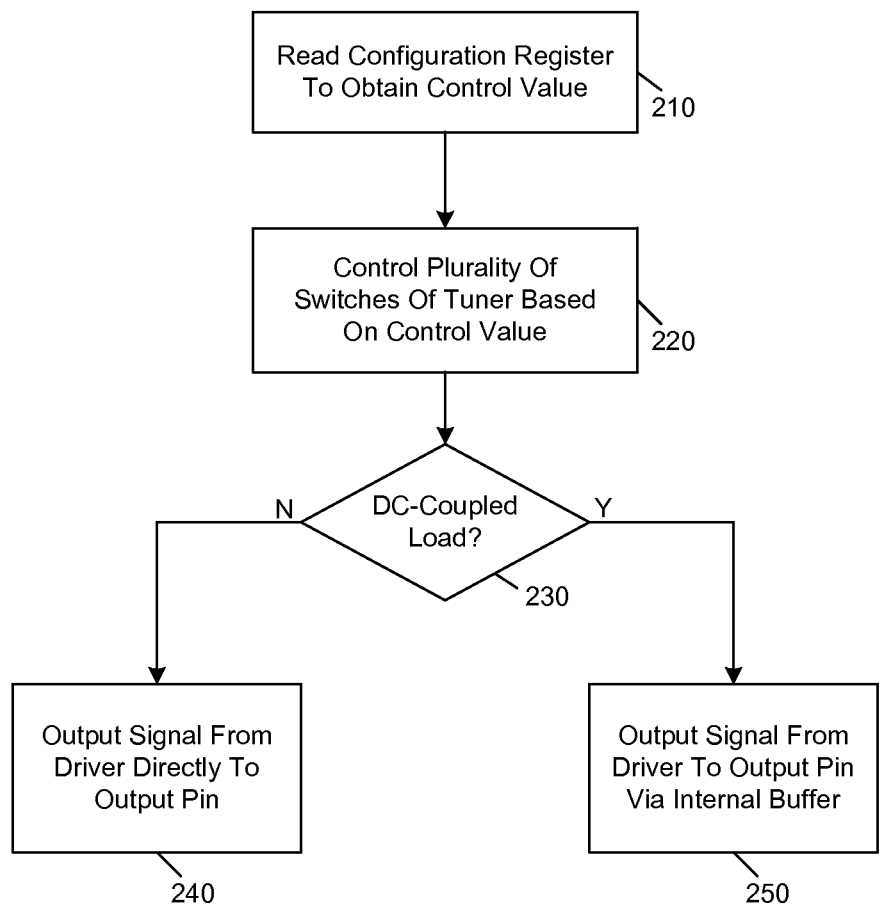
FIG. 5 is a flow diagram of a method of operating a circuit in accordance with an embodiment of the present invention.

Referring now to FIG. 5, shown is a flow diagram of a method of operating a circuit in accordance with an embodiment of the present invention. As shown in FIG. 5, method 200 can be implemented within an IC, such as a TV tuner that is configurable to disable an internal buffer, such as the 75 ohm internal buffer of FIG. 1. As seen in FIG. 5, method 200 can begin by reading a configuration register to obtain a control value (block 210). In an embodiment, this configuration register can be set by a system vendor and be stored in a non-volatile storage where the value can be loaded into a configuration register on power up. From this configuration register the control value, which may be a set of bits, can be obtained. In one embodiment, each of a plurality of bits can be used to control a given switch such as switches S1-S4 shown in the embodiment of FIG. 1.

Accordingly as seen in FIG. 5, at block 220 a plurality of switches can be controlled based on the control value. More specifically, it can be determined whether a load coupled to the tuner is DC-coupled (diamond 230). Note that this determination may be based on the configuration register setting, which as described above can be originally set on implementation of a tuner into a given system that either has or does not have a DC-coupled load to the tuner. When the tuner is implemented in a system having a DC-coupled load, the control of the switches may be such that the internal buffer is enabled. Thus at block 250 a signal output from a driver of the tuner can be delivered to an output pin of the tuner via the internal buffer. Instead, when a AC-coupled load is present, at block 240 the output signal from the driver may be directly coupled to the output pin to thus enable an AC-coupled arrangement, e.g., via an AC-coupled external driver. Note that although shown in the embodiment of FIG. 5 as including a determination as to whether a DC-load is coupled, note that a controller does not actually make this determination; instead simply based on the control value, the control switches will be arranged accordingly, either to enable or disable the internal buffer. Note also that a technique to automatically determine the nature of the load can also be used to identify the load and configure the circuit accordingly.

Figure 6:
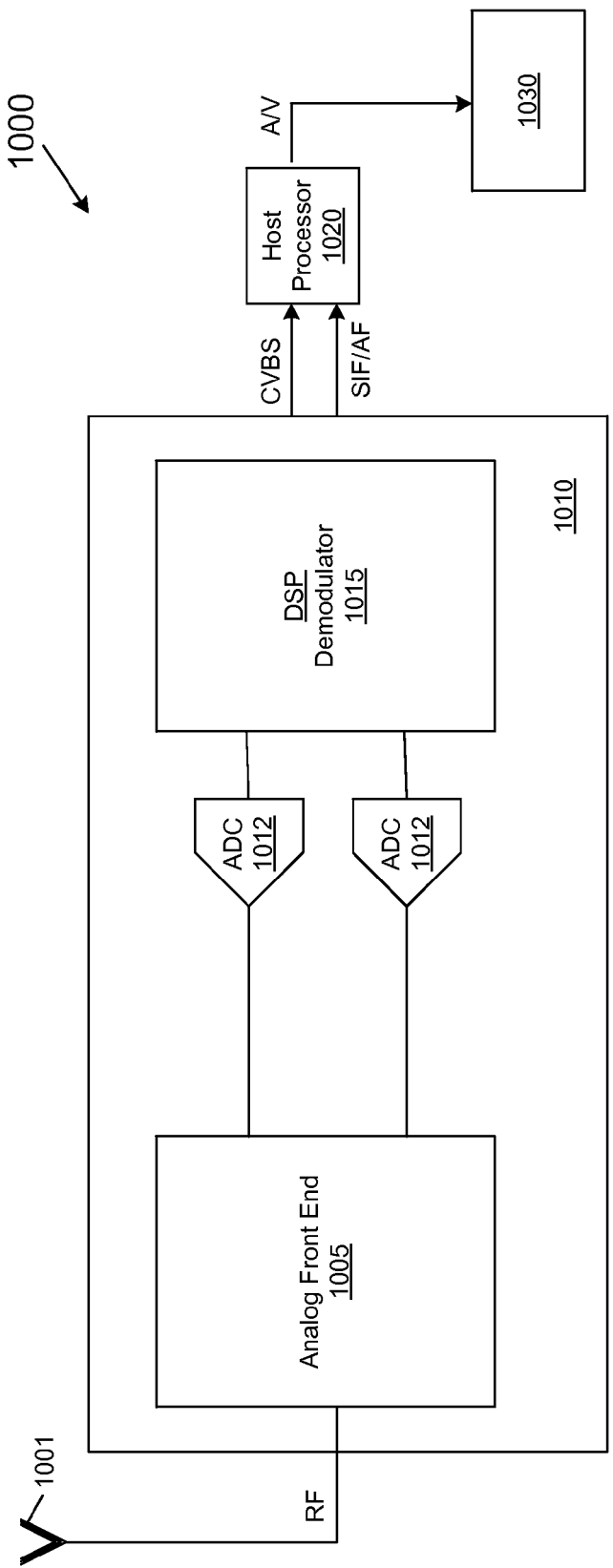
FIG. 6 is a block diagram of a system in accordance with one embodiment of the present invention.

Embodiments may be implemented in many different system types, such as wireless devices, set-top boxes, televisions, and so forth. Some applications may be implemented in a mixed signal circuit that includes both analog and digital circuitry. Referring now to FIG. 6, shown is a block diagram of a system in accordance with one embodiment of the present invention. As shown in FIG. 6, system 1000 may include a television that is coupled to receive a RF signal from an antenna source 1001 such as an over-the-air antenna 1001. However, in other embodiments the original source may be cable distribution, satellite, or other source that is then redistributed through a digital terrestrial network. The incoming RF signal may be provided to a tuner 1010 which may be, in one embodiment, a single-chip mixed signal device including both a tuner and a demodulator for analog signals.

More specifically, the incoming RF signal is provided to an analog front end 1005 of the tuner for tuning to a desired signal channel. While the scope of the present invention is not limited in this regard, front end 1005 may include various circuitry. For example, in one embodiment front end 1005 may include a bandpass filter having an output coupled to a low noise amplifier (LNA) to receive and amplify the RF signal. The output of the LNA may be provided to another bandpass filter that in turn is coupled to a mixer. In turn, the mixer downconverts the incoming RF signal to a complex output. This complex output (i.e., I/Q data) may be at IF, low-IF, or zero-IF in different systems. As shown in FIG. 6, analog front end 1005 may be coupled to analog-to-digital converters (ADCs) 1012 to convert the incoming I/Q data to digital form, to provide a modulated bitstream of a desired signal channel. The signal channel information may be provided to a digital signal processor (DSP) 1015 which can perform various digital-based processing operations, including analog demodulation to obtain a CVBS signal and a SIF/AF signal that can be provided to a host processor 1020. Host processor 1020 may further process the information into an audio visual signal that may be provided to a display 1030, such as a computer monitor, flat panel display or other such display.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    an amplifier configured on an integrated circuit (IC) to receive and amplify an input signal received via a first input terminal of the amplifier to an amplified signal to be output via a first pin of the IC;
    a feedback loop coupled between an output of the amplifier and the first input terminal, the feedback loop including:
        a first path having a first switch enabled to selectively directly couple the amplified signal to the first pin; and
        a second path having a buffer to convert the amplified signal to an output current to be output via the first pin of the IC, when the first switch is disabled.

2. The apparatus of claim 1, wherein the first switch is controlled based on a configuration setting of the IC.

3. The apparatus of claim 1, wherein the first switch is to selectively directly couple the amplified signal to the first pin when the IC is coupled to an external driver circuit, and wherein the first switch is disabled when the IC is to directly couple to a CVBS interconnect.

4. The apparatus of claim 1, wherein the buffer includes:
    a converter to convert the amplified signal to a current signal;
    a first current mirror to receive the current signal and to amplify the current signal to a first amplified current signal; and
    a second current mirror coupled to the first current mirror to receive the first amplified current signal and to amplify the first amplified current signal to an output current, and to output the output current to the first pin.

5. The apparatus of claim 4, wherein the first current mirror includes:
    a first transistor and a second transistor having commonly coupled gate terminals and commonly coupled first terminals, and wherein a second terminal of the first transistor is coupled to the commonly coupled gate terminals when the buffer is enabled.

6. The apparatus of claim 5, wherein a second terminal of the second transistor is coupled to the second current mirror.

7. The apparatus of claim 5, further comprising a second switch to couple the gate terminals of the first and second transistors to the first terminals of the first and second transistors when the buffer is disabled.

8. The apparatus of claim 5, wherein the second current mirror includes:
    a third transistor and a fourth transistor having commonly coupled gate terminals and commonly coupled first terminals, and wherein a second terminal of the third transistor is coupled to the commonly coupled gate terminals when the buffer is enabled.

9. The apparatus of claim 8, further comprising a third switch to couple the gate terminals of the third and fourth transistors to the first terminals of the third and fourth transistors when the buffer is disabled.

10. The apparatus of claim 5, further comprising a first current source to provide a first bias current to the second terminal of the first transistor.

11. The apparatus of claim 5, further comprising a second current source to provide a second bias current to the second terminal of the second transistor.

* * * * *